US007132362B2

(12) United States Patent
Jeong

(10) Patent No.: US 7,132,362 B2
(45) Date of Patent: Nov. 7, 2006

(54) SEMICONDUCTOR DEVICE WITH CONTACTS HAVING UNIFORM CONTACT RESISTANCE AND METHOD FOR MANUFACTURING THE SAME

(75) Inventor: Mun-Mo Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/003,386

(22) Filed: Oct. 30, 2001

(65) Prior Publication Data

US 2002/0113283 A1   Aug. 22, 2002

(30) Foreign Application Priority Data

Feb. 21, 2001   (KR) ................... 2001-8755

(51) Int. Cl.
*H01L 21/4763*   (2006.01)
*H01L 21/302*   (2006.01)
*H01L 21/469*   (2006.01)

(52) U.S. Cl. ............. 438/634; 438/636; 438/637; 438/740; 438/774

(58) Field of Classification Search ........... 438/634, 438/636–637, 740, 774; 257/774
See application file for complete search history.

(56) References Cited

U.S. PATENT DOCUMENTS

| | | | | |
|---|---|---|---|---|
| 4,515,151 A | * | 5/1985 | Slemmons et al. | 126/569 |
| 5,231,053 A | * | 7/1993 | Bost et al. | 438/627 |
| 5,702,981 A | | 12/1997 | Maniar et al. | |
| 5,707,901 A | * | 1/1998 | Cho et al. | 438/595 |
| 5,985,751 A | * | 11/1999 | Koyama | 438/632 |
| 6,008,114 A | * | 12/1999 | Li | 438/618 |
| 6,140,225 A | * | 10/2000 | Usami et al. | 438/622 |
| 6,281,585 B1 | * | 8/2001 | Bothra | 257/758 |

FOREIGN PATENT DOCUMENTS

| | | |
|---|---|---|
| JP | 11087507 | 3/1999 |
| KR | 2000-56260 | 9/2000 |

OTHER PUBLICATIONS

English translation abstract of Korean Patent No. 2000-56260.

* cited by examiner

*Primary Examiner*—Douglas W. Owens
*Assistant Examiner*—Samuel Admassu
(74) *Attorney, Agent, or Firm*—Marger, Johnson & McCollom, P.C.

(57) ABSTRACT

A semiconductor device having a contact hole capable of maintaining contact resistance of a contact connecting multi-layered interconnections with each other and a method for manufacturing the same are provided. An interconnection layer, a capping layer, and an etching stopper are sequentially formed on a semiconductor substrate. An interlayer insulating layer is deposited over the resulting structure. The etching stopper is formed of a material having a high etching selectivity with respect to the interlayer insulating layer. Then a first contact hole is formed to expose the surface of the etching stopper by etching a predetermined portion of the interlayer insulating layer. Either the etching stopper exposed by the first contact hole or the etching stopper exposed by the first contact hole and part of the capping layer are etched to form a second contact hole. As a result, it is possible to manufacture a semiconductor device having uniform contact resistance over the surface of the semiconductor substrate, irrespective of topology of a lower interconnection layer or the degree of flatness of the interlayer insulating layer covering the lower interconnection layer.

15 Claims, 6 Drawing Sheets

SEMICONDUCTOR DEVICE WITH CONTACTS HAVING UNIFORM CONTACT RESISTANCE AND METHOD FOR MANUFACTURING THE SAME

RELATED APPLICATION

This application relies for priority upon Korean Patent Application No. 2001-8755, filed on Feb. 21, 2001, the contents of which are herein incorporated by reference in their entirety.

BACKGROUND OF THE INVENTION

1. Field of the Invention

The present invention relates to a semiconductor device and a method for manufacturing the same and the semiconductor device, and more particularly, to a semiconductor device having a contact hole which is capable of maintaining contact resistance of a contact connecting multi-layered interconnections and a method for manufacturing the same.

2. Description of the Related Art

As the integration density of semiconductor devices increases, a multi-layered interconnection structure is required. However, in most cases, an insulating layer on which an interconnection layer will be placed is not flat, and thus contact resistance is not uniform along the entire surface of a semiconductor substrate. This problem will be described with reference to FIG. 1.

Referring to FIG. 1, a transistor (not shown) or a capacitor (not shown) is formed on a semiconductor substrate 10, and a first interlayer insulating layer 12 is formed before an interconnection layer 14 is formed. To planarize the first interlayer insulating layer 12, chemical mechanical polishing (CMP) may be used. Even if the CMP technique is performed on the entire surface of the semiconductor substrate 10, it is very difficult to etch the first interlayer insulating layer 12 to a uniform thickness. In addition, CMP equipment is very expensive.

Thus, in most cases, an interconnection layer 14 and a capping layer 16 are formed on the first interlayer insulating layer 12 that is not planarized. Thus, the thickness of a second interlayer insulating layer 18 formed on the interlayer insulating layer 12 is not uniform.

The interconnection layer 14 is a metal layer containing aluminum. Contact holes 20a, 20b and 20c are formed by etching predetermined portions of the second interlayer insulating layer 18 covering the interconnection layer 14. In this case, oxygen components in the second interlayer insulating layer 18 may diffuse outwardly and then react with aluminum components in the interconnection layer 14 exposed by the contact holes 20a, 20b and 20c. Due to the reaction of oxygen with aluminum, an aluminum oxide layer (not shown), an insulating layer, is formed on the bottom surface of the contact holes 20a, 20b and 20c, that is, the top surface of the interconnection layer 14. To prevent the formation of the aluminum oxide layer, a capping layer 16, which is conductive and can prevent the reaction of oxygen with aluminum is formed on the interconnection layer 14. The capping layer 16 is usually formed of TiN, Ti/TiN, or TaN. Since the capping layer 16 has high resistance, the capping layer 16 is slightly etched to a predetermined depth so that the bottom surface of the contact holes 20a, 20b and 20c is within the capping layer 16.

As described above, the thickness of the second interlayer insulating layer 18 covering the interconnection layer 14 and the capping layer 16 is not uniform along the entire surface of the semiconductor substrate 10. Accordingly, the thickness of the capping layer 16 remaining on the interconnection layer 14 after the etching process for forming the contact holes 20a, 20b, and 20c is not uniform. As a result, the contact resistance of the interconnection layer 14 varies, and thus the speed of information transmission may be different for different regions of the semiconductor device. In other words, the reliability of the semiconductor device may be lowered.

SUMMARY OF THE INVENTION

To solve the above problems, it is a first object of the present invention to provide a semiconductor device having a contact hole by which a uniform contact resistance value can be obtained from any region of the surface of a semiconductor substrate.

It is a second object of the present invention to provide a method for manufacturing a semiconductor device having a contact hole by which a uniform contact resistance value can be obtained from any region of the surface of a semiconductor substrate.

Accordingly, to achieve the first object, there is provided a semiconductor device including a semiconductor substrate; an interconnection layer formed on a portion of the semiconductor substrate; an interlayer insulating layer formed on the entire surface of the interconnection layer of the semiconductor substrate and including a contact hole placed on the interconnection layer; a capping layer formed from the top surface of the interconnection layer to the bottom surface of the contact hole; an etching stopper formed on the capping layer along the outside walls of the contact hole; and a conductive layer filling the contact hole.

The capping layer may be in contact with the bottom surface and portions of the sidewalls of the contact hole. The interconnection layer is formed of a metal layer containing aluminum. The capping layer is formed of one of TiN, Ti/TiN, and TaN. The conductive layer is formed only in the contact hole, or the conductive layer is an upper interconnection layer filling the contact hole and covering the top surface of the interlayer insulating layer.

To achieve the second object of the present invention, there is provided a method for manufacturing a semiconductor device including sequentially forming an interconnection layer, a capping layer, and an etching stopper on a semiconductor substrate; forming an interlayer insulating layer having a first contact hole exposing a portion of the surface of the etching stopper using a material having a high selectivity with respect to the etching stopper; forming a second contact hole to expose the top surface of the capping layer by removing the etching stopper exposed by the first contact hole; and forming a conductive layer to fill the second contact hole.

The method for manufacturing a semiconductor device further includes forming a third contact hole by slightly etching a portion the capping layer exposed by the second contact hole before forming a conductive layer. Here, the conductive layer fills the second contact hole and the third contact hole. The second and third contact holes are formed by performing a dry etching method using an etchant having a low selectivity between the etching stopper and the capping layer. The interconnection layer, the capping layer, and the etching stopper are formed by sequentially depositing material layers for forming the interconnection layer, the capping layer, and the etching stopper, and patterning the material layers by the same etching process.

The interconnection layer is a metal layer containing aluminum. The capping layer is formed of one of TiN, Ti/TiN and TaN. The interlayer insulating layer is formed of one selected from the group consisting of a silicon oxide layer, a silicon nitride layer, borophosphosilicate glass (BPSG), phosphosilicate glass (PSG), borosilicate glass (BSG), tetraethylorthosilicate (TEOS), plasma enhanced TEOS (PE-TEOS), and undoped silicate glass (USG).

The conductive layer may be formed only in the second contact hole or may be formed only in the second and third contact holes. Or the conductive layer may be an upper interconnection layer filling the second contact hole and covering the top surface of the interlayer insulating layer. Or the conductive layer may be an upper interconnection layer filling the second and third contact holes and covering the top surface of the interlayer insulating layer.

It is possible to obtain uniform contact resistance between the lower interconnection layer and the upper interconnection layer from any region of the surface of a semiconductor substrate irrespective of the degree of flatness of an interlayer insulating layer placed under the lower interconnection layer. Therefore, it is possible to prevent the reliability of a semiconductor device from being lowered.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

The present invention will now be described more fully with reference to the accompanying drawings in which preferred embodiments of the invention are shown.

Figure 1:
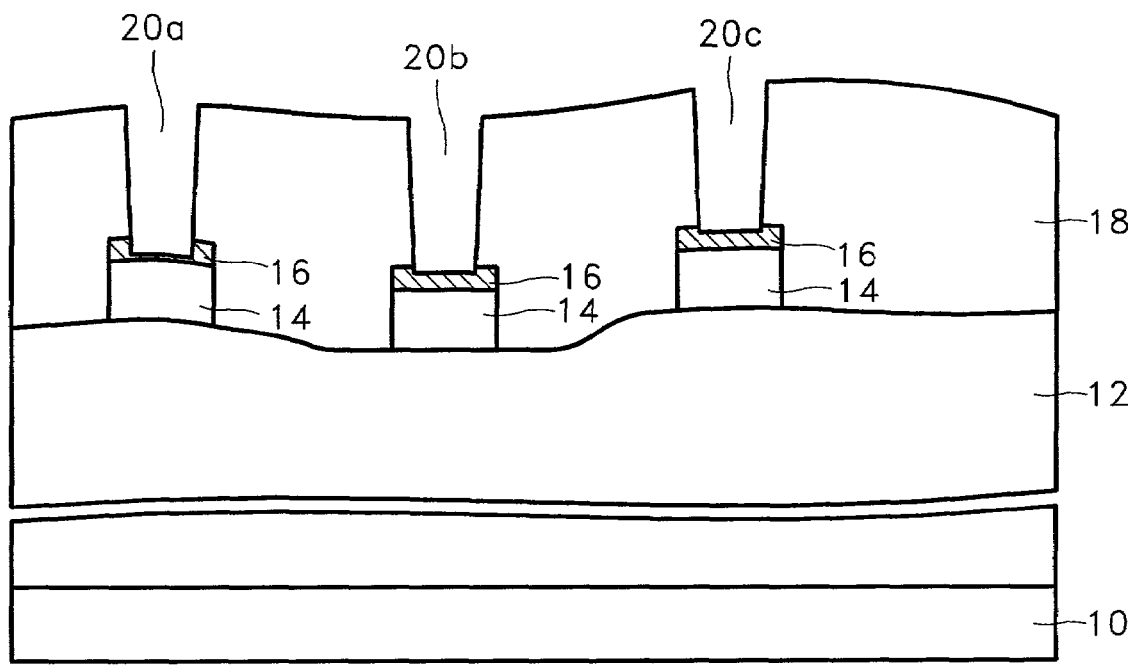
FIG. 1 is a cross-sectional view of a semiconductor device having a conventional contact hole for connecting multi-layered interconnection layers with each other.
Figure 2:
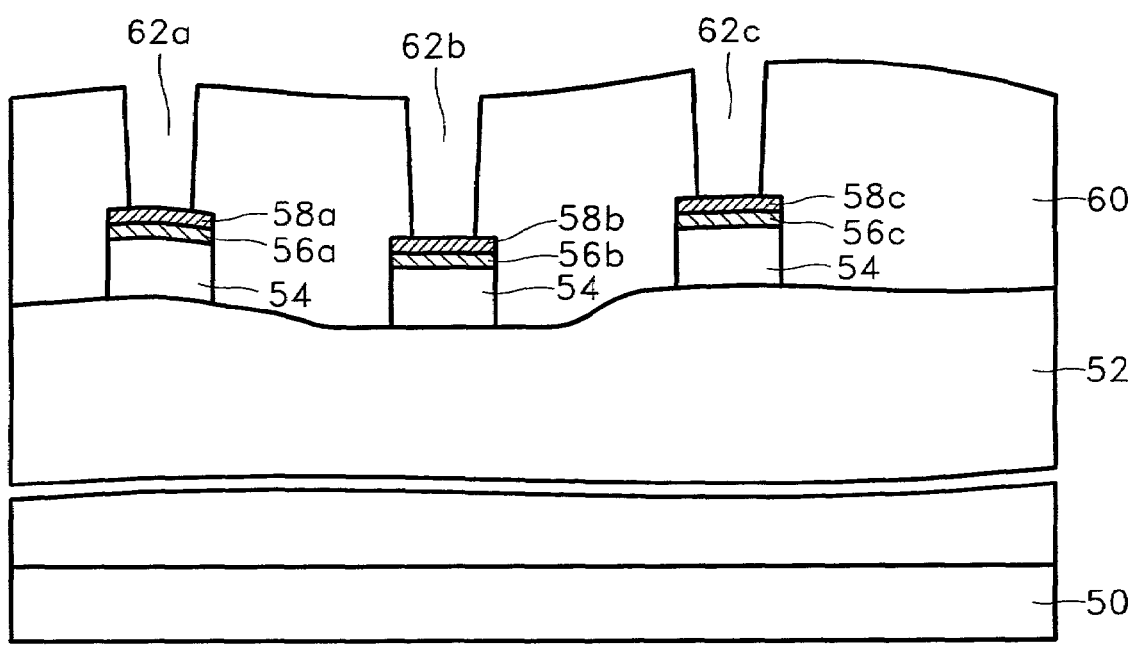
FIGS. 2, 3, 4A and 4B are cross-sectional views illustrating a method for manufacturing a semiconductor device having a contact hole for connecting multi-layered interconnection layers with each other according to the present invention.

Referring to FIG. 2, a transistor (not shown) or a capacitor (not shown) is formed on a semiconductor substrate 50, and then a first interlayer insulating layer 52 is formed before an interconnection layer is formed.

Figure 6:
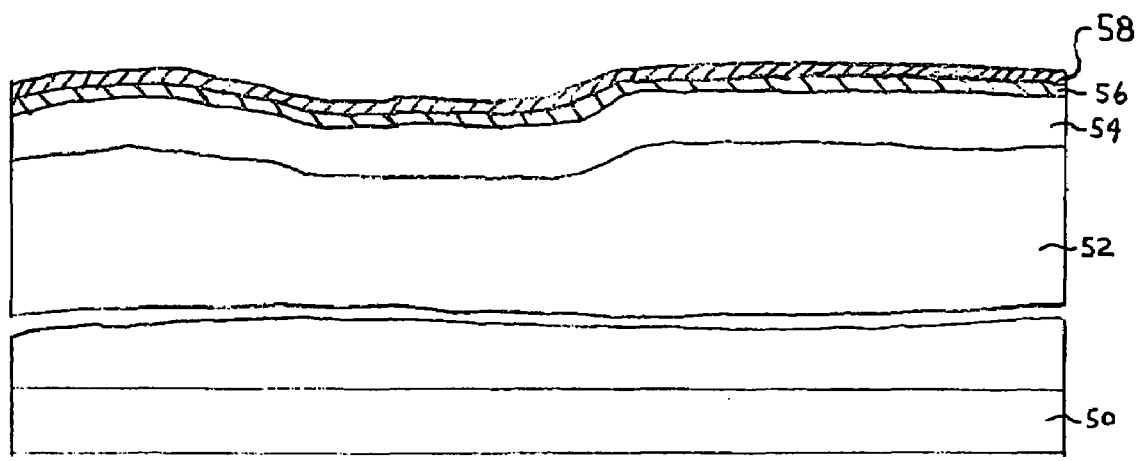
FIG. 6 is a cross-sectional view illustrating forming the first, second and third layers according to an embodiment of the invention.
Figure 7:
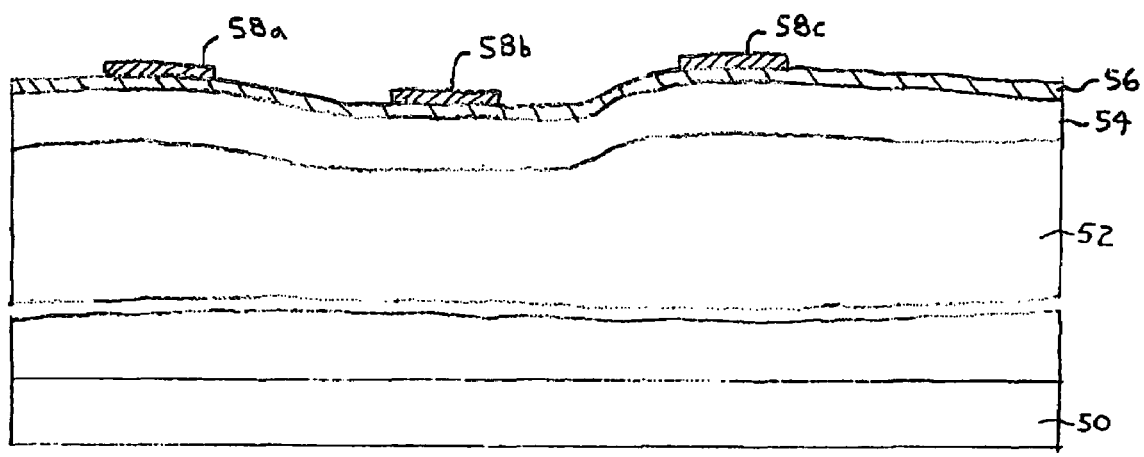
FIG. 7 is a cross-sectional view illustrating patterning the third layer according to an embodiment of the invention.
Figure 8:
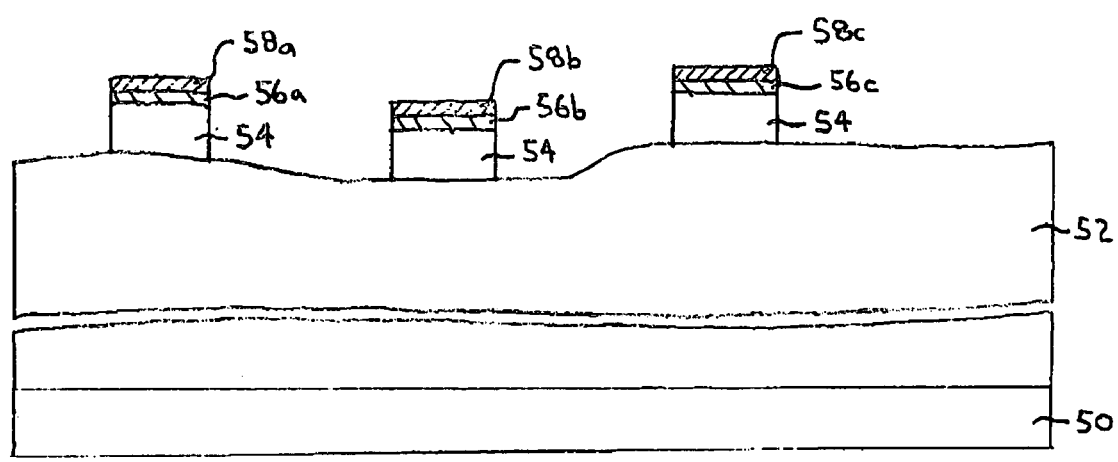
FIG. 8 is a cross-sectional view illustrating patterning of the first and second layers according to an embodiment of the invention.

As shown in FIG. 6, a conductive layer for interconnections 54, a material layer for capping 56, and a material layer for stopping etching 58 are sequentially deposited on the surface of the first interlayer insulating layer 52. As shown in FIG. 7, the material layer for stopping etching 58 is patterned to form etching stoppers 58a, 58b, and 58c. Then, as shown in FIG. 8, the material layer for capping 56 and the conductive layer for interconnections 54 are patterned using the patterned material layer for stopping etching 58. As a result, interconnection layers 54, capping layers 56a, 56b, and 56c and etching stoppers 58a, 58b, and 58c are sequentially formed. The interconnection layers 54 are a metal layer containing aluminum, and the capping layers 56a, 56b, and 56c are formed of TiN, Ti/TiN or TaN. The etching stoppers 58a, 58b, 58c are formed of a material having a high etching selectivity with respect to a second interlayer insulating layer 60 which will be formed later, such as an inorganic anti-reflecting layer (ARL) or an organic anti-reflecting coat (ARC) which is typically used in a semiconductor device.

Next, the second interlayer insulating layer 60 is formed over the surface of the first interlayer insulating layer 52 on which the interconnection layers 54, the capping layers 56a, 56b, and 56c and the etching stoppers 58a, 58b, and 58c have been formed. The second interlayer insulating layer 60 is a silicon oxide layer, a silicon nitride layer, borophosphosilicate glass (BPSG), phosphosilicate glass (PSG), borosilicate glass (BSG), tetraethylorthosilicate (TEOS), plasma enhanced TEOS (PE-TEOS), or undoped silicate glass (USG). The surface of the second interlayer insulating layer 60, as well as that of the first interlayer insulating layer 52, is not flat. Thus, the thickness of a portion of the second interlayer insulating layer 60 on one of the etching stoppers 58a, 58b, and 58c is different from the thickness of a portion of the second interlayer insulating layer 60 on the others. For example, the portion of the second insulating layer 60 over the etching stopper 58b is thicker than over the etching stoppers 58a and 58c.

Next, predetermined portions of the second interlayer insulating layer 60 are etched by using a dry etching method so that first contact holes 62a, 62b, and 62c are formed. The first contact holes 62a, 62b, and 62c expose the etching stoppers 58a, 58b, and 58c. As described above, the thickness of a portion of the second interlayer insulating layer 60 on one of the etching stoppers 58a, 58b, and 58c is different from the thickness of a portion of the second interlayer insulating layer 60 on the others. In particular, the portion of the second insulating layer 60 over the etching stopper 58b is thicker than over the etching stoppers 58a and 58c. Thus, the portion of the second interlayer insulating layer 60 on the etching stopper 58b (shown in the middle of FIG. 2) should be etched most deeply. Each of the etching stoppers 58a, 58b, and 58c is formed of a material having a high etching selectivity with respect to the interlayer insulating layer 60. Accordingly, even if an etching process is further performed on the second insulating layer 60 remaining on etching stopper 58b (not shown) after the first contact holes 62a, 62b and 62c are formed, the etching stoppers 58a and 58c exposed by the contact holes 62a and 62c, respectively, will hardly be etched.

Figure 3:
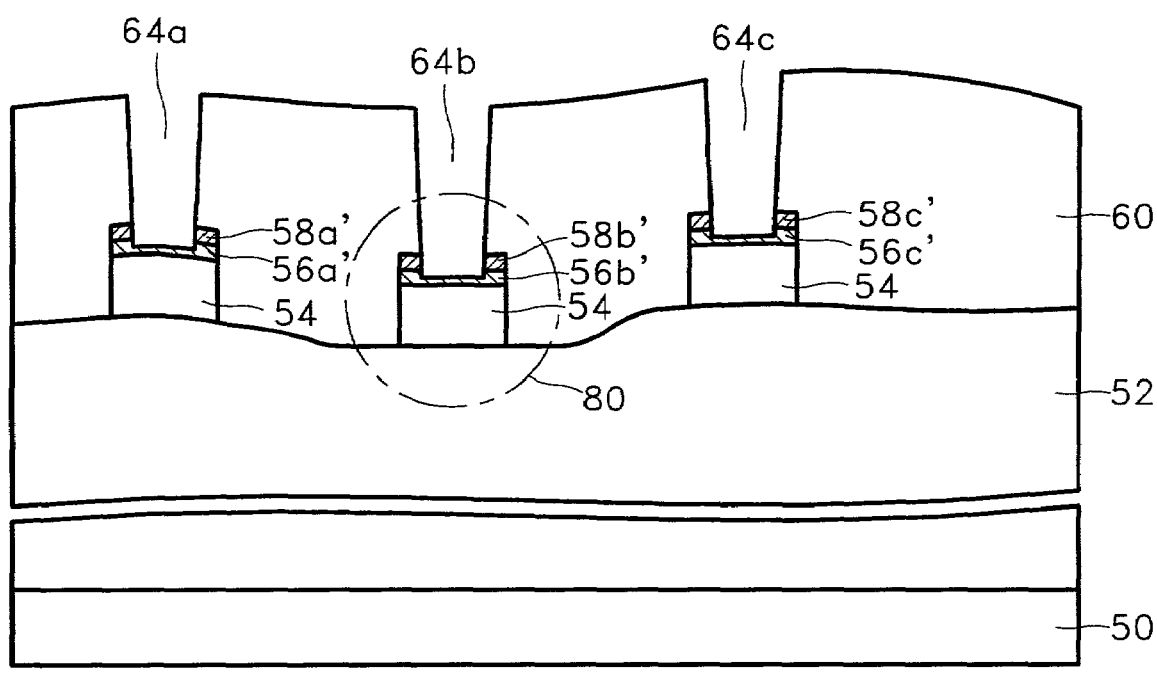

Referring to FIG. 3, the exposed etching stoppers 58a, 58b, and 58c and portions of the capping layers 56a, 56b, and 56c are removed so that second contact holes 64a, 64b, and 64c are formed. The second contact holes 64a, 64b, and 64c are formed by performing a dry etching method using an etchant having a low etching selectivity between the etching stoppers 58a, 58b, 58c and the capping layers 56a, 56b, and 56c. The bottom surfaces of the first contact holes 62a, 62b and 62c were the top surfaces of the etching stoppers 58a, 58b, and 58c in FIG. 2. In forming the second contact holes 64a, 64b, and 64c, the etching stoppers 58a, 58b, and 58c of FIG. 2 are etched through, and the capping layers 56a, 56b, and 56c of FIG. 2 are etched to a uniform thickness over the surface of the semiconductor substrate. As a result, after the second contact holes 64a, 64b, and 64c are formed, capping layers 56a', 56b', and 56c' are formed to have a uniform thickness, and thus the contact resistance of the interconnection layers 54 is substantially uniform.

Figure 4A:
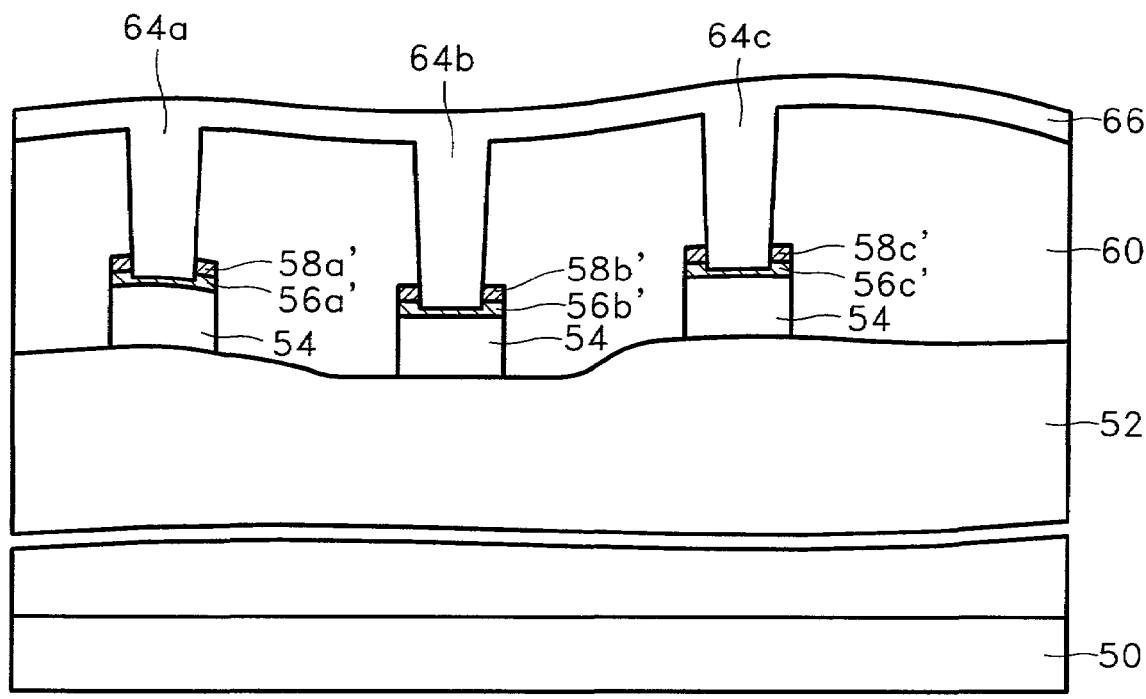
Figure 4B:
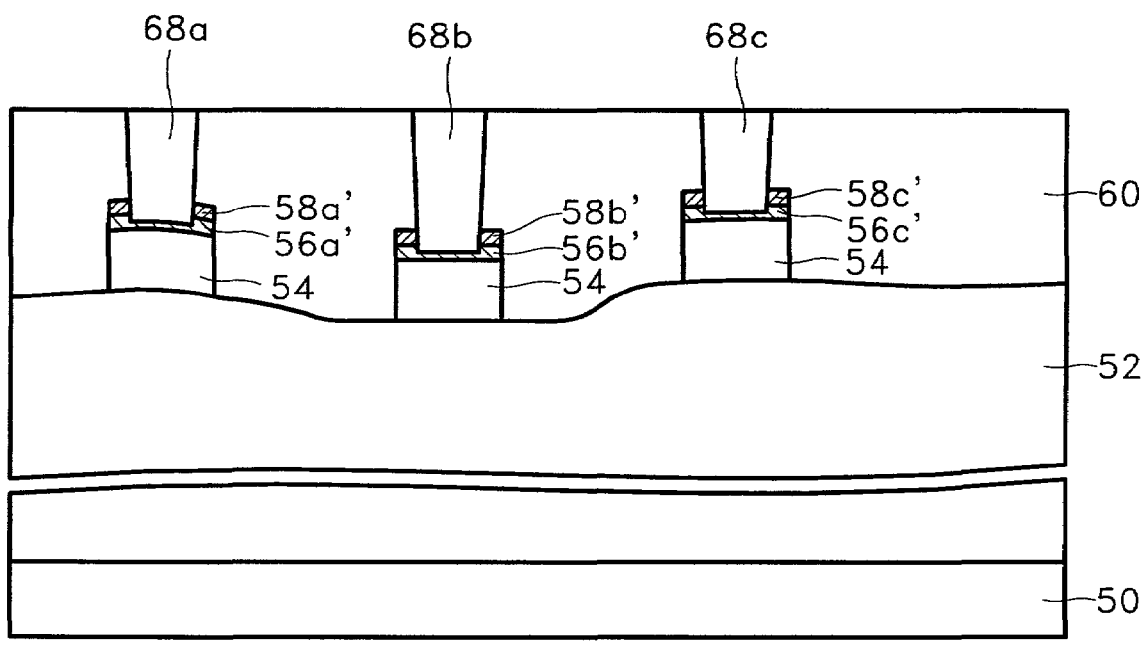

Subsequently, a conductive layer is formed over the surface of the second interlayer insulating layer 60 including the second contact holes 64a, 64b and 64c to fill the second contact holes 64a, 64b, and 64c. The conductive layer may be formed of aluminum or tungsten. FIG. 4A illustrates an upper interconnection layer 66 which is formed by filling the second contact holes 64a, 64b, and 64c and covering the top surface of the second interlayer insulating layer 60 with the above-mentioned conductive layer. On the other hand, FIG. 4B illustrates landing plugs 68a, 68b and 68c formed by just filling the contact holes 64a, 64b and 64c with the conductive layer.

Figure 5A:
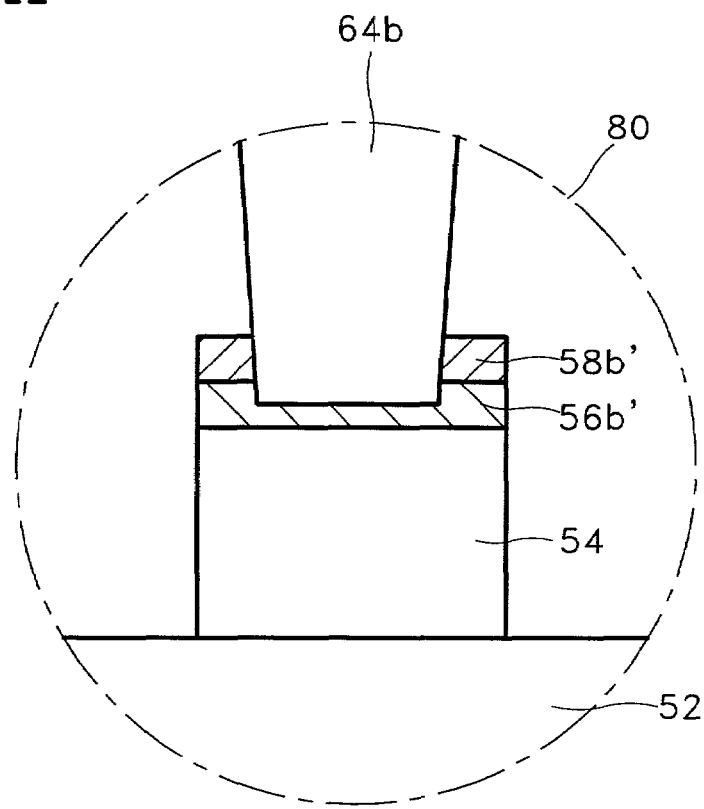
FIG. 5A is a diagram illustrating one embodiment of the relationship between a contact hole and a capping layer.
Figure 5B:
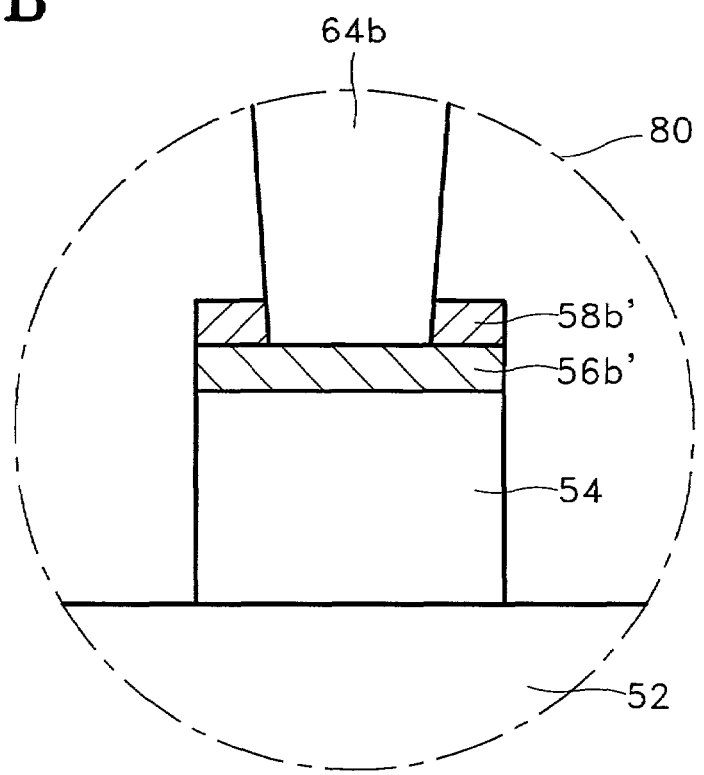
FIG. 5B is a diagram illustrating another embodiment of the relationship between a contact hole and a capping layer.

FIG. 5A is a diagram showing in more detail the etching stopper 58b' and the capping layer 56b'. The portion indicated by reference numeral 80 associated with the second contact hole 64b includes the etching stopper 58b', the capping layer 56b', and the interconnection layer 54. Alternatively, the bottom surfaces of the second contact holes 64a, 64b, and 64c can be the top surfaces of the capping layers 56a, 56b, and 56c as illustrated in FIG. 5B.

According to the present invention, it is possible for the bottom surface of a contact hole for connecting a lower interconnection layer to an upper interconnection layer to be at the top surface of a capping layer on the lower interconnection layer or in the capping layer, irrespective of topology of the lower interconnection layer or the degree of flatness of an interlayer insulating layer covering the lower interconnection layer. Therefore, it is possible to obtain a uniform contact resistance value from any region of the surface of a semiconductor substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a semiconductor device comprising:

forming plural interconnection lines, each comprising an interconnection layer, a capping layer, the capping layer defining a contact resistance, and an etching stopper, on a semiconductor substrate;

forming an interlayer insulating layer overlying the plural interconnection lines, wherein the thickness of a portion of the interlayer insulating layer on one of the etching stoppers is different from the thickness of a portion of the interlayer insulating layer on the others;

etching the interlayer insulating layer to form first contact holes therein;

stopping etching when a top surface of each etching stopper is exposed;

removing a portion of each etching stopper exposed by the first contact holes by performing a dry etching method using an etchant having a low etching selectivity between the etching stopper and the capping layer, thereby forming second contact holes, and leaving the capping layers of the plural interconnection lines at substantially the same thickness such that the contact resistances of the plural interconnection lines are substantially uniform; and forming a conductive layer within the second contact holes, wherein the interconnection layer, the capping layer, and the etching stopper are formed by sequentially depositing a first material layer for interconnection, a second material layer for capping, and a third material layer for stopping etching, patterning the third material layer, and then patterning the second and first material layers, using the patterned third material layer.

2. The method for manufacturing a semiconductor device of claim 1 further comprising forming third contact holes by slightly etching a portion of the capping layer exposed by the second contact holes before forming the conductive layer, and wherein the conductive layer is formed within the second contact holes and the third contact holes.

3. The method for manufacturing a semiconductor device of claim 2, wherein the conductive layer is formed only in the second and third contact holes.

4. The method for manufacturing a semiconductor device of claim 2, wherein the conductive layer is an upper interconnection layer filling the second and third contact holes and covering the top surface of the interlayer insulating layer.

5. The method for manufacturing a semiconductor device of claim 2 wherein the third contact holes are formed by performing a dry etching method using an etchant having a low etching selectivity between the etching stopper and the capping layer.

6. The method for manufacturing a semiconductor device of claim 1, wherein the etching stopper is formed of an inorganic anti-reflecting layer (ARL) or an organic anti-reflecting coating (ARC).

7. The method for manufacturing a semiconductor device of claim 1, wherein the interconnection layer is a metal layer containing aluminum.

8. The method for manufacturing a semiconductor device of claim 1, wherein the capping layer is formed of TiN, Ti/TiN or TaN.

9. The method for manufacturing a semiconductor device of claim 1, wherein the interlayer insulating layer is formed of one selected from the group consisting of a silicon oxide layer, a silicon nitride layer, borophosphosilicate glass (BPSG), phosphositicate glass (PSG), borosilicate glass (BSG), tetraethylorthosilicate (TEOS), plasma enhanced TEOS (PE-TEOS), and undoped silicate glass (USG).

10. The method for manufacturing a semiconductor device of claim 1, wherein the conductive layer is formed only in the second contact holes.

11. The method for manufacturing a semiconductor device of claim 1, wherein the conductive layer is an upper interconnection layer filling the second contact holes and covering the top surface of the interlayer insulating layer.

12. The method for manufacturing a semiconductor device of claim 1, wherein the first contact holes are formed by using a dry etching method.

13. The method for manufacturing a semiconductor device of claim 1, wherein the capping layers are etched to form a uniform thickness among the second contact holes.

14. The method for manufacturing a semiconductor device of claim 1, wherein the second contact holes expose a top surface of the capping layers.

15. A method for manufacturing a semiconductor device comprising:

forming plural interconnection lines, each comprising an interconnection layer, a capping layer, the capping layer defining a contact resistance, and an etching stopper, on a semiconductor substrate;

forming an interlayer insulating layer overlying the plural interconnection lines, wherein the thickness of a portion of the interlayer insulating layer on one of the etching stoppers is different from the thickness of a portion of the interlayer insulating layer on the others;

etching the interlayer insulating layer to form first contact holes therein;

stopping etching when a top surface of each etching stopper is exposed;

removing a portion of each etching stopper exposed by the first contact holes, thereby forming second contact holes, and leaving the capping layers of the plural interconnection lines at substantially the same thickness such that the contact resistances of the plural interconnection lines are substantially uniform; and forming a conductive layer within the second contact holes, wherein the interconnection layer, the capping layer, and the etching stopper are formed by sequentially depositing a first material layer for interconnection, a second material layer for capping, and a third material layer for stopping etching, patterning the third material layer, and then patterning the second and first material layers, using the patterned third material layer.

* * * * *